US008421941B2

(12) United States Patent
Tsuda et al.

(10) Patent No.: US 8,421,941 B2
(45) Date of Patent: Apr. 16, 2013

(54) TFT SUBSTRATE AND METHOD OF MANUFACTURING THE SAME

(75) Inventors: Kumi Tsuda, Kumamoto (JP); Kazunori Inoue, Tokyo (JP); Masaru Aoki, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 373 days.

(21) Appl. No.: 12/831,658

(22) Filed: Jul. 7, 2010

(65) Prior Publication Data

US 2011/0017993 A1 Jan. 27, 2011

(30) Foreign Application Priority Data

Jul. 23, 2009 (JP) ................. 2009-171984

(51) Int. Cl.
*G02F 1/136* (2006.01)
(52) U.S. Cl.
USPC ........................................................... 349/43
(58) Field of Classification Search ...................... 349/43
See application file for complete search history.

(56) References Cited

U.S. PATENT DOCUMENTS

| 5,726,077 A | 3/1998 | Kawahata et al. |
| 5,811,835 A | 9/1998 | Seiki et al. |
| 5,837,559 A | 11/1998 | Kawahata et al. |
| 5,869,351 A | 2/1999 | Kawahata et al. |
| 5,879,958 A | 3/1999 | Kawahata et al. |
| 6,235,561 B1 | 5/2001 | Seiki et al. |
| 2002/0018176 A1 | 2/2002 | Kobayashi et al. |
| 2002/0048861 A1* | 4/2002 | Seo ............................... 438/149 |
| 2003/0058379 A1* | 3/2003 | Lee ................................. 349/43 |
| 2005/0212986 A1 | 9/2005 | Kawasaki |
| 2008/0049176 A1* | 2/2008 | Kim et al. ..................... 349/114 |

FOREIGN PATENT DOCUMENTS

| JP | 8-50308 | 2/1996 |
| JP | 9-64366 | 3/1997 |
| JP | 2001-339072 | 12/2001 |
| JP | 2002-151381 | 5/2002 |
| JP | 2005-283689 | 10/2005 |

* cited by examiner

*Primary Examiner* — Phu Vu
(74) *Attorney, Agent, or Firm* — Oblon, Spivak, McClelland, Maier & Neustadt, L.L.P.

(57) ABSTRACT

There is provided a TFT substrate including a gate electrode having a thick film part and a thin film part with a smaller film thickness than the thick film part, a semiconductor active film formed above the thick film part and the thin film part of the gate electrode, an ohmic contact film formed on an inside of the semiconductor active film and on the semiconductor active film corresponding to the thin film part on an outside of the thick film part, and an electrode film constituting a source electrode and a drain electrode, having a planar shape identical to or on an inside of the ohmic contact film, and formed on the ohmic contact film.

10 Claims, 9 Drawing Sheets

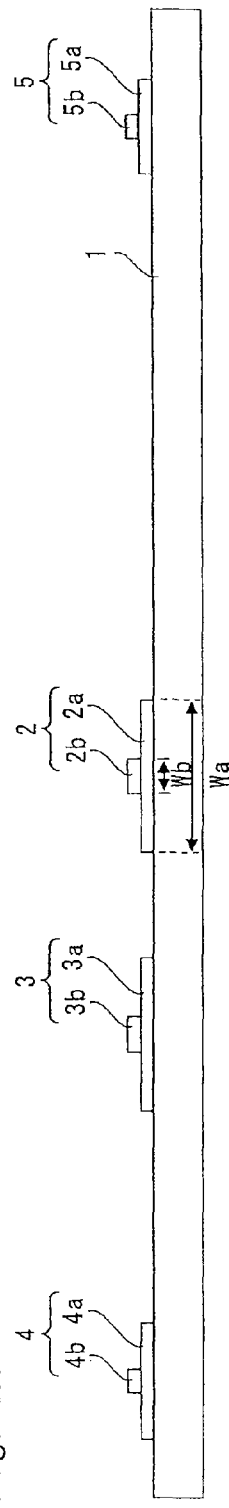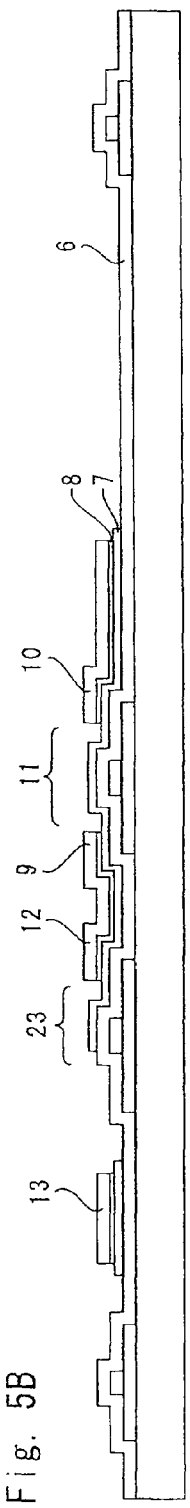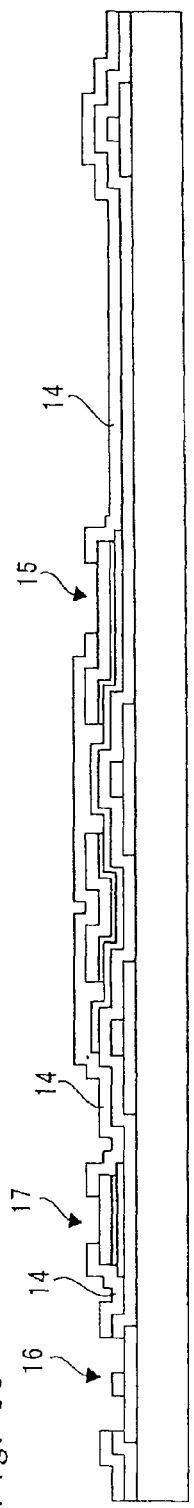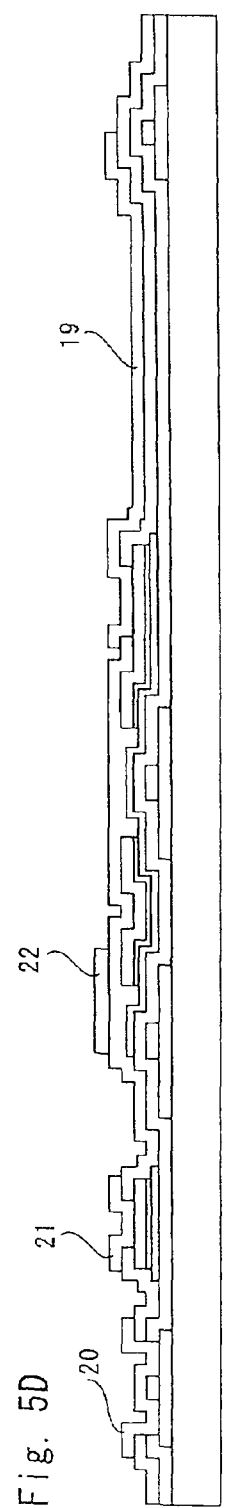
Fig. 5A
Fig. 5B
Fig. 5C
Fig. 5D

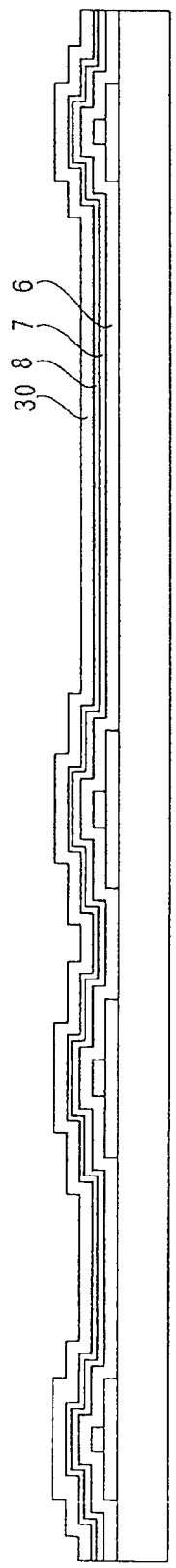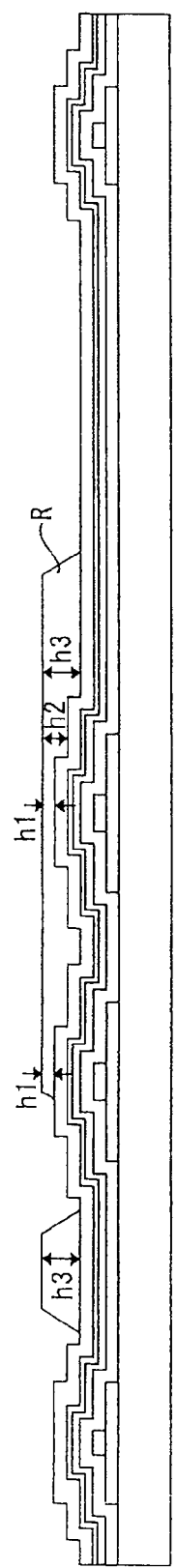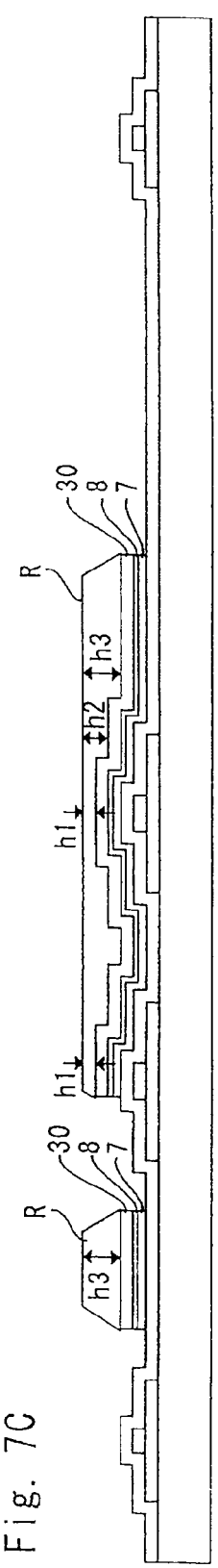

TFT SUBSTRATE AND METHOD OF MANUFACTURING THE SAME

INCORPORATION BY REFERENCE

This application is based upon and claims the benefit of priority from Japanese patent application No. 2009-171984, filed on Jul. 23, 2009, the disclosure of which is incorporated herein in its entirety by reference.

BACKGROUND OF THE INVENTION

1. Field of the Invention

The present invention relates to a TFT substrate and a method of manufacturing the same.

2. Description of Related Art

A liquid crystal display device for display using liquid crystals is widely applied to products having features of low power consumption and low profile type as one of flat panel displays as an alternative to a cathode ray tube (CRT).

A simple matrix liquid crystal display device and an active matrix liquid crystal display device are among types of the liquid crystal display device for display using liquid crystals. The active matrix liquid crystal display device is a TFT-LCD that uses a thin film transistor (TFT) as a switching element, for example. The TFT-LCD has features superior to the CRT or the simple matrix liquid crystal display device in terms of portability and display quality, and it is widely applied in practice to notebook personal computers or the like. In the TFT-LCD, a liquid crystal layer is generally placed between a TFT array substrate and a counter substrate. TFTs are arranged in an array on the TFT array substrate. Polarizing plates are respectively placed on the outer side of the TFT array substrate and the counter substrate, and a backlight is further placed on one side. In such a structure, suitable color display can be obtained.

However, when manufacturing the TFT array substrate used in the TFT-LCD, it is necessary to form TFTs in an array on a glass substrate by using semiconductor technology, thus requiring a large number of manufacturing steps. Therefore, various defects and failures are likely to occur to cause a decrease in yield, and a large number of devices are required for manufacture to cause an increase in manufacturing cost.

As a method frequently used hitherto as a manufacturing method of a TFT array substrate for LCD, Japanese Unexamined Patent Application Publication No. 8-50308 discloses several manufacturing methods using five-time photolithography processes (5 mask processes) and structures thereof.

Further, a method of manufacturing a TFT array substrate by four-time photolithography processes (which is referred to hereinafter as 4 mask process) by using halftone exposure technology on the basis of the basic structure described in the seventh embodiment (paragraphs 0083 to 0089 and FIGS. 54 to 63) of Japanese Unexamined Patent Application Publication No. 8-50308 is disclosed in Japanese Unexamined Patent Application Publication No. 2005-283689 (paragraphs 0019 to 0025 and FIGS. 14 to 15) and Japanese Unexamined Patent Application Publication No. 2001-339072. In the 4 mask process, the film thicknesses of photoresist are varied by using the halftone exposure technology. The process then forms a semiconductor active layer, source and drain electrodes and a channel region of a TFT by using the resist having different film thicknesses. Thus, two-time (second and third) photolithography processes can be collectively performed as one-time photolithography process.

SUMMARY OF THE INVENTION

However, the 4 mask process as disclosed in Japanese Unexamined Patent Application Publication No. 2005-283689 has an issue that it is extremely difficult to control the TFT channel length. As described above, the 4 mask process forms resist patterns having at least two different film thicknesses, i.e. a resist pattern with a large film thickness and a resist pattern with a small film thickness. Specifically, the process forms resist patterns by one-time photolithography process, while two-time photolithography processes have been required heretofore. The process then forms a semiconductor active layer, a source electrode and a drain electrode by using the resist patterns.

Therefore, it is extremely difficult to control the width of the resist pattern with a small film thickness. It is thus extremely difficult to control the width of the semiconductor active layer, called the TFT channel length, which is determined by the width of the resist pattern. In other words, it is extremely difficult to control the distance between the source electrode and the drain electrode. Note that the above issue is described in the paragraph 0030 of Japanese Unexamined Patent Application Publication No. 2005-283689.

In order to accurately control the TFT channel length, it is necessary to accurately control all parameters such as a resist film thickness uniformity before exposure, resist film quality uniformity, optimum (halftone) exposure intensity, resist development characteristics uniformity and uniformity in the process of reducing resist. Particularly, under the present circumstances, it is extremely difficult to control the photolithography technique that leaves thin resist and the process technique that uniformly reduces the resist. Therefore, in a display panel using the TFT array substrate manufactured in the 4 mask process used hitherto, TFTs with different channel lengths exist in the panel. As a result, variation occurs in TFT characteristics, which causes display unevenness and point defect, raising issues such as degradation of display quality and a decrease in yield.

Further, because metal for forming the source electrode and the drain electrode is etched twice, there has been an issue that, when using wet etching, a break (stepped cut) of a source line is likely to occur in a step portion at the intersection with a gate line. Although a technique that regulate the resist baking temperature after halftone exposure in order to suppress variation in the channel length is also disclosed in Japanese Unexamined Patent Application Publication No. 2002-151381 (paragraphs 0008 to 0009), it has still been difficult to effectively prevent the stepped cut of the source line.

In light of the foregoing, it is desirable to provide a TFT substrate with reduced variation in productivity and characteristics and improved performance, a TFT substrate with a suppressed source-drain leakage current and a reduced off-current, and a method of manufacturing the same.

A first exemplary aspect of the present invention is a TFT substrate including a gate electrode having a thick film part and a thin film part with a smaller film thickness than the thick film part, a semiconductor active film formed above the thick film part and the thin film part of the gate electrode, an ohmic contact film formed on an inside of the semiconductor active film and on the semiconductor active film corresponding to the thin film part on an outside of the thick film part, and an electrode film constituting a source electrode and a drain electrode, having a planar shape identical to or on an inside of the ohmic contact film, and formed on the ohmic contact film.

A second exemplary aspect of the present invention is a method of manufacturing a TFT substrate including steps of forming a gate electrode having a thick film part and a thin film part with a smaller film thickness than the thick film part, depositing a semiconductor active film, an ohmic contact film and an electrode film sequentially above the gate electrode, applying photoresist on the electrode film, forming a photoresist pattern by exposing the photoresist with use of a photomask pattern with two different levels of exposure intensity, etching the semiconductor active film, the ohmic contact film and the electrode film with use of the photoresist pattern as a mask, thinning the photoresist pattern and removing the photoresist pattern above the thick film part, and forming a source electrode, a drain electrode and a channel region by etching the electrode film and the ohmic contact film with use of the thinned photoresist pattern as a mask.

According to the exemplary aspects of the present invention described above, it is possible to provide a TFT substrate with improved productivity and performance and a method of manufacturing the same.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIGS. 5A to 5D are sectional views showing a manufacturing method of the TFT substrate according to the exemplary embodiment;

FIGS. 7A to 7E are sectional views showing a detail of the manufacturing method shown in FIG. 5B according to the exemplary embodiment.

DESCRIPTION OF THE EXEMPLARY EMBODIMENTS

Exemplary Embodiment

Figure 1:
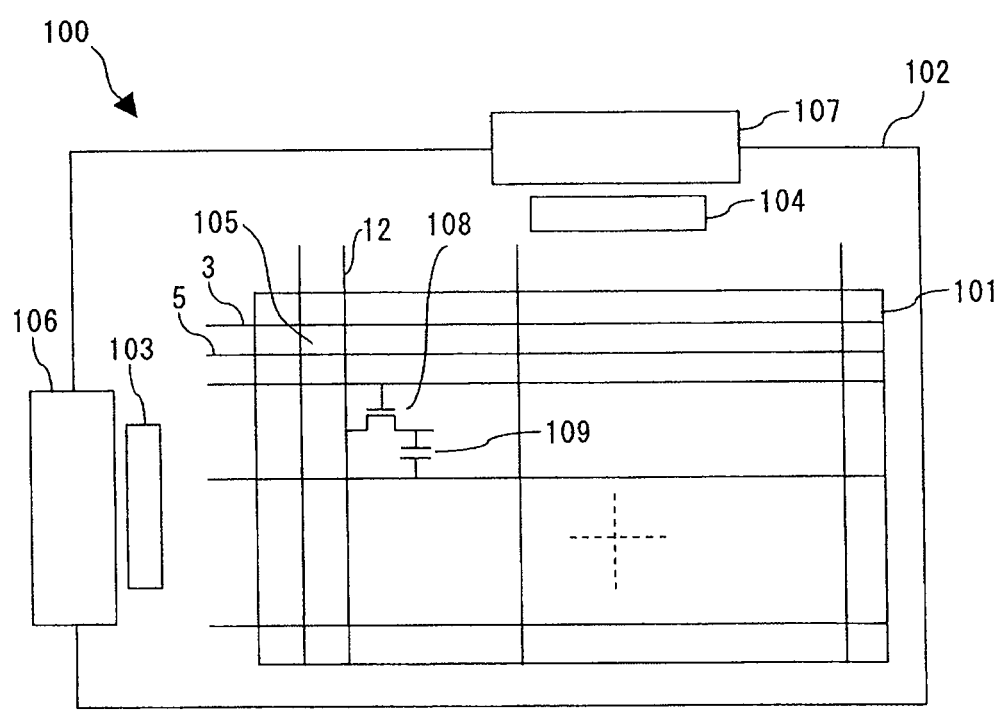
FIG. 1 is a plan view showing a structure of a TFT substrate according to an exemplary embodiment.

A TFT substrate according to an exemplary embodiment of the present invention is a substrate that uses a thin film transistor (TFT) as a switching element. The TFT substrate is used for a flat display device (flat panel display) such as a liquid crystal display device (LCD) or an organic electroluminescence (EL) display device. Referring first to FIG. 1, the TFT substrate is described. FIG. 1 is a plan view showing the structure of the TFT substrate. Hereinafter, the TFT substrate is described in detail by using a TFT substrate for LCD as an example.

A TFT substrate 100 is a TFT array substrate in which TFTs 108 are arranged in an array, for example. The TFT substrate 100 includes a display area 101 and a frame area 102 surrounding the display area 101. In the display area 101, a plurality of gate lines (scan signal lines) 3, a plurality of auxiliary capacitor electrodes 5, and a plurality of source lines (display signal lines) 12 are placed.

The plurality of gate lines 3 and the plurality of auxiliary capacitor electrodes 5 are placed in parallel. The auxiliary capacitor electrodes 5 are respectively placed between the adjacent gate lines 3. Thus, the gate lines 3 and the auxiliary capacitor electrodes 5 are arranged alternately with each other. Further, the plurality of source lines 12 are placed in parallel. The gate lines 3 and the source lines 12 are arranged to intersect with each other. Likewise, the auxiliary capacitor electrodes 5 and the source lines 12 are arranged to intersect with each other. The gate lines 3 and the source lines 12 are orthogonal to each other. Likewise, the auxiliary capacitor electrodes 5 and the source lines 12 are orthogonal to each other. A region surrounded by the adjacent gate line 3 and auxiliary capacitor electrode 5 and the adjacent source lines 12 is a pixel 105 (cf. FIG. 2). In the TFT substrate 100, the pixels 105 are arranged in matrix.

Further, a scan signal driver 103 and a display signal driver 104 may be placed in the frame area 102 of the TFT substrate 100. The gate lines 3 extend from the display area 101 to the frame area 102. The gate lines 3 are connected to the scan signal driver 103 at the end of the TFT substrate 100. The source lines 12 also extend from the display area 101 to the frame area 102. The source lines 12 are connected to the display signal driver 104 at the end of the TFT substrate 100. An external wiring 106 is connected in close proximity to the scan signal driver 103. Further, an external wiring 107 is connected in close proximity to the display signal driver 104. The external wirings 106 and 107 are wiring boards such as a flexible printed circuit (FPC), for example.

Various kinds of external signals are supplied to the scan signal driver 103 and the display signal driver 104 through the external wirings 106 and 107. The scan signal driver 103 supplies a gate signal (scan signal) to the gate lines 3 according to an external control signal. In response to the gate signal, the gate lines 3 are sequentially selected. The display signal driver 104 supplies a display signal to the source lines 12 according to an external control signal or display data. A display voltage corresponding to the display data can be thereby supplied to the respective pixels 105. The scan signal driver 103 and the display signal driver 104 are not necessarily placed on the TFT substrate 100. For example, the drivers may be connected by tape carrier package (TCP).

In the pixel 105, at least one TFT 108 and an auxiliary capacitor 109 are placed. In the pixel 105, the TFT 108 and the auxiliary capacitor 109 are connected in series. The TFT 108 is placed in close proximity to an intersection between the source line 12 and the gate line 3. The TFT 108 serves as a switching element for supplying a display voltage to a pixel electrode, for example. A gate electrode of the TFT 108 is connected to the gate line 3, and ON and OFF of the TFT 108 are controlled according to a gate signal that is input through the gate terminal. A source electrode of the TFT 108 is connected to the source line 12. When a voltage is applied to the gate electrode and the TFT 108 is turned ON, a current flows from the source line 12. A display voltage is thereby applied to the pixel electrode that is connected to a drain electrode of the TFT 108. Then, an electric field corresponding to the display voltage is generated between the pixel electrode and a counter electrode.

On the other hand, the auxiliary capacitor 109 is electrically connected also to the counter electrode through the auxiliary capacitor electrode 5, not only to the TFT 108. Thus, the auxiliary capacitor 109 is connected in parallel to a capacitor between the pixel electrode and the counter electrode. The auxiliary capacitor 109 can hold a voltage applied to the pixel electrode for a given length of time. An alignment layer (not shown) is placed on the surface of the TFT substrate 100. The TFT substrate 100 has the above-described structure.

Further, in the case of the liquid crystal display device, a counter substrate is placed opposite to the TFT substrate 100. The counter substrate is a color filter substrate, for example, and placed on the viewing side. In the counter substrate, a color filter, a black matrix (BM), a counter electrode, an alignment layer and so on are placed. In the case of an IPS liquid crystal display device, for example, the counter electrode is placed on the TFT substrate 100 side. The TFT substrate 100 and the counter electrode are attached with a certain space (cell gap) therebetween. Liquid crystals are injected and sealed in the gap. In other words, a liquid crystal layer is placed between the TFT substrate 100 and the counter substrate. Further, a polarizing plate, a phase difference plate and so on are placed on the respective outer sides of the TFT substrate 100 and the counter substrate. Furthermore, a backlight unit or the like is placed on the non-viewing side of the liquid crystal display panel having the above structure.

The liquid crystals are driven by the electric field between the pixel electrode and the counter electrode. Specifically, the orientation of the liquid crystals between the substrates varies. The polarization state of light passing through the liquid crystal layer is thereby changed. Specifically, the polarization state of light that has been linearly polarized through the polarizing plate is changed by the liquid crystal layer. To be more precise, light from the backlight unit is linearly polarized by the polarizing plate on the TFT substrate 100 side. The linearly polarized light then passes through the liquid crystal layer, thereby changing its polarization state.

Accordingly, the amount of light passing through the polarizing plate on the counter substrate side varies depending on the polarization state. Specifically, the amount of light passing through the polarizing plate on the viewing side, among transmitted light that is transmitted through the liquid crystal display panel from the backlight unit, varies. The orientation of the liquid crystals varies by the applied display voltage. Thus, the amount of light passing through the polarizing plate on the viewing side can be changed by controlling the display voltage. Specifically, a desired image can be displayed by changing the display voltage with respect to each pixel. Note that, in the series of operations, an electric field is generated in parallel with the electric field between the pixel electrode and the counter electrode in the auxiliary capacitor 109, which contributes to maintaining the display voltage.

Figure 2:
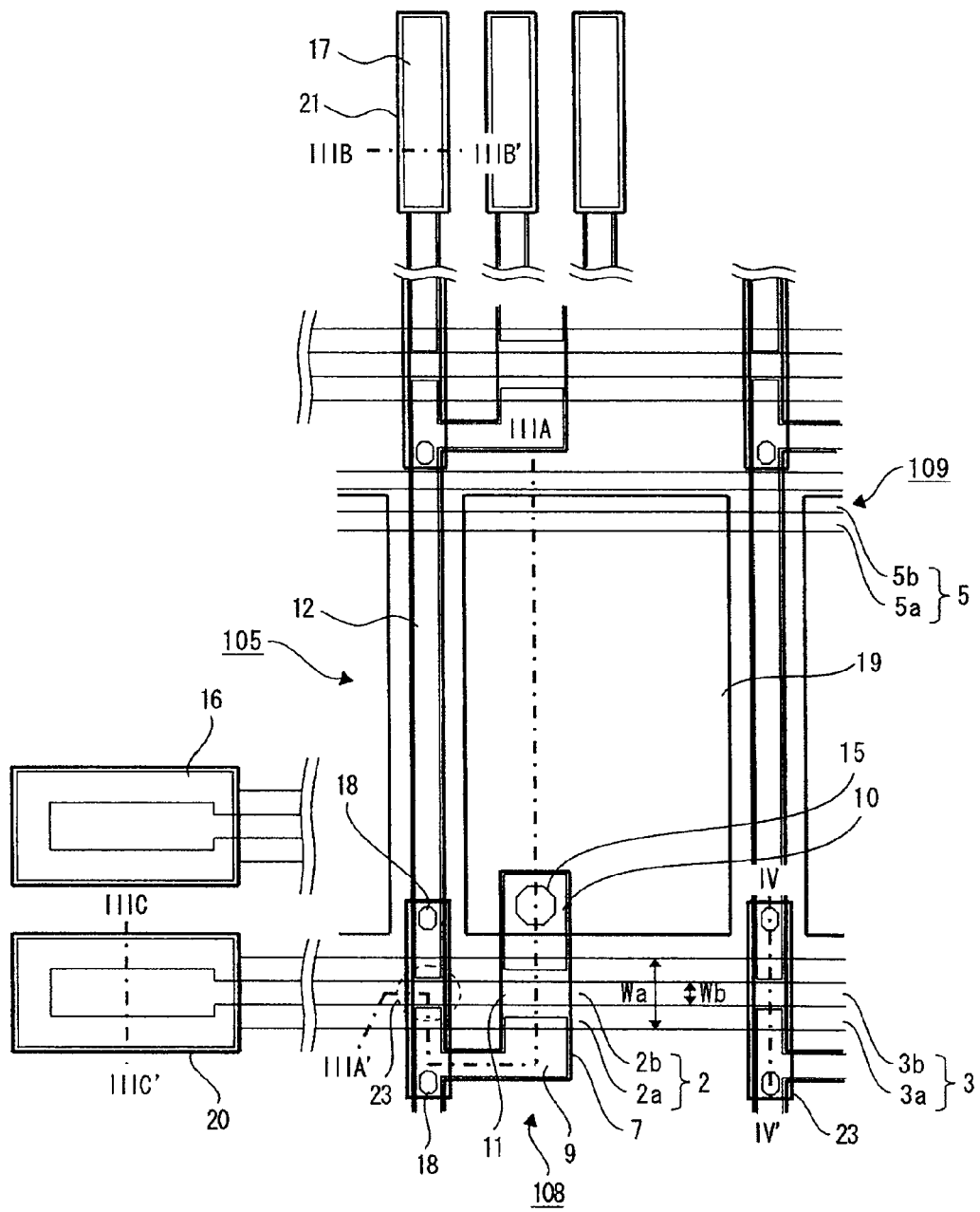
FIG. 2 is a plan view showing a structure of a substantial part of the TFT substrate according to the exemplary embodiment.
Figure 3:
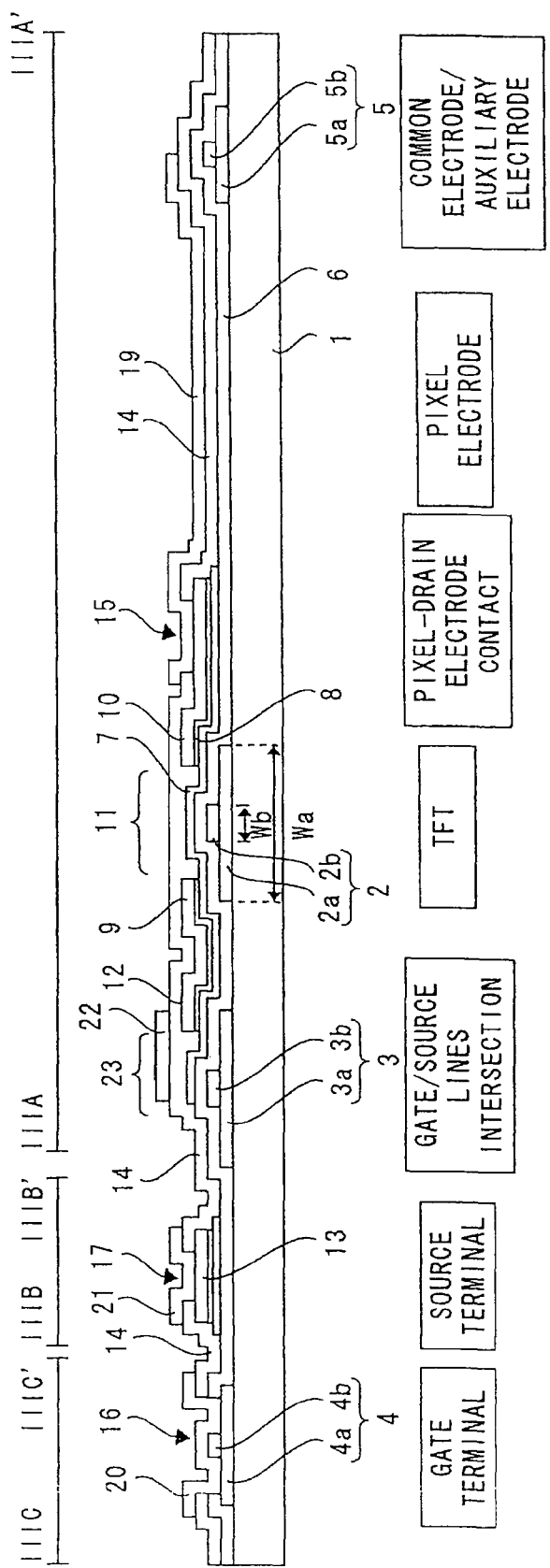
FIG. 3 is a sectional view showing a structure along lines IIIA-IIIA', IIIB-IIIB' and IIIC-IIIC' in FIG. 2.
Figure 4:
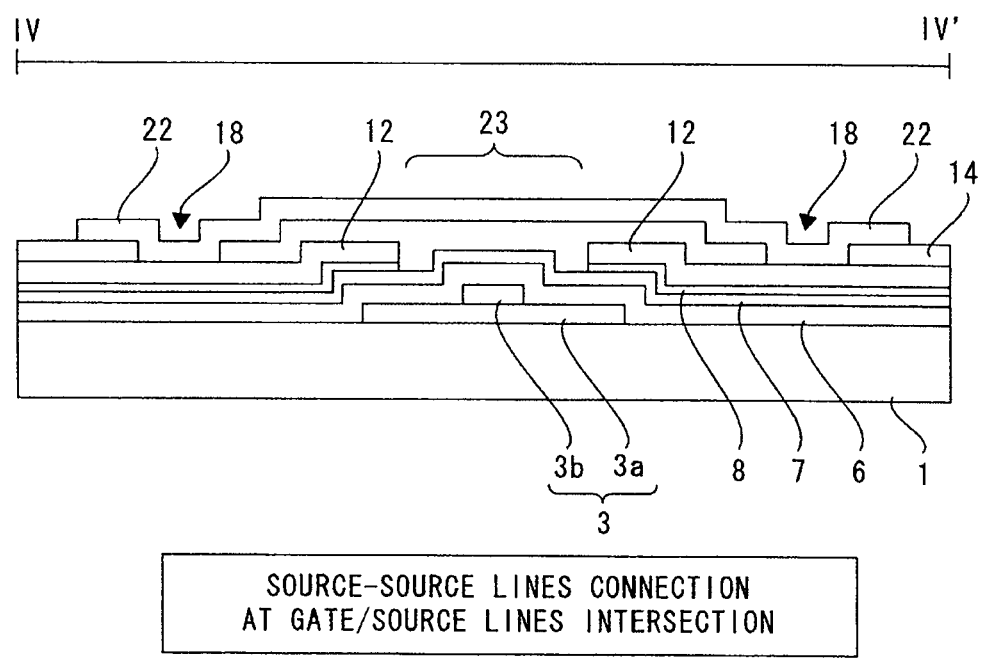
FIG. 4 is a sectional view showing a structure along line IV-IV' in FIG. 2.

The structure of the substantial part of the TFT substrate 100 is described hereinafter with reference to FIGS. 2 to 4. FIG. 2 is a plan view showing the structure of the substantial part of the TFT substrate 100 according to the exemplary embodiment. FIG. 3 is a sectional view showing the structure along lines IIIA-IIIA', IIIB-IIIB' and IIIC-IIIC' in FIG. 2. The line IIIA-IIIA' shows the structure of the pixel 105, the line IIIB-IIIB' shows the structure of a source terminal part, and the line IIIC-IIIC' shows the structure of a gate terminal part. FIG. 4 is a sectional view showing the structure along line IV-IV' in FIG. 2.

In the TFT substrate 100, the gate lines 3, the source lines 12 and the auxiliary capacitor electrodes 5 are placed. In FIG. 2, the gate lines 3 are placed horizontally, and the source lines 12 are placed vertically. Further, the auxiliary capacitor electrodes 5 are placed in parallel with the gate lines 3. A rectangular region surrounded by the gate line 3, the auxiliary capacitor electrode 5, and the two source lines 12 serves as the pixel 105.

Referring to FIG. 3, a gate electrode 2, a gate line 3, a gate terminal 4 and an auxiliary capacitor electrode 5 are placed on an insulating substrate 1. A transparent insulating substrate made of glass, plastic or the like may be used as the insulating substrate 1. The gate electrode 2 includes a first conductive film 2a and a second conductive film 2b that are placed sequentially from the insulating substrate 1 side. The gate line 3 includes a first conductive film 3a and a second conductive film 3b that are placed sequentially from the insulating substrate 1 side. The gate terminal 4 includes a first conductive film 4a and a second conductive film 4b that are placed sequentially from the insulating substrate 1 side. The auxiliary capacitor electrode 5 includes a first conductive film 5a and a second conductive film 5b that are placed sequentially from the insulating substrate 1 side. The first conductive films 2a, 3a, 4a and 5a are formed in the same layer. Further, the second conductive films 2b, 3b, 4b and 5b are formed in the same layer.

The width Wa of the first conductive films 2a, 3a, 4a and 5a is wider than the width Wb of the second conductive films 2b, 3b, 4b and 5b. The second conductive films 2b, 3b, 4b and 5b are placed on the inside of the first conductive films 2a, 3a, 4a and 5a. Further, the second conductive films 2b, 3b, 4b and 5b are placed on substantially the center part of the first conductive films 2a, 3a, 4a and 5a. Thus, the gate electrode 2, the gate line 3, the gate terminal 4 and the auxiliary capacitor electrode 5 have a raised shape at substantially the center part. Specifically, the gate electrode 2, the gate line 3, the gate terminal 4 and the auxiliary capacitor electrode 5 have the shape in which the center is thick and the both ends in the width direction are thin. The part where the second conductive films 2b, 3b, 4b and 5b are formed is a thick film part. The part where only the first conductive films 2a, 3a, 4a and 5a are formed on the outside of the second conductive films 2b, 3b, 4b and 5b is a thin film part having a smaller film thickness than the thick film part. In other words, the gate electrode 2, the gate line 3, the gate terminal 4 and the auxiliary capacitor electrode 5 have the shape in which a raised step is formed in stripe. The gate electrode 2, the gate line 3, the gate terminal 4 and the auxiliary capacitor electrode 5 are integrally formed. The gate terminal 4 is formed at the end of the gate line 3. The gate terminal 4 is connected to the scan signal driver 103 shown in FIG. 1, and a scan signal is input to the gate terminal 4.

A gate insulating film 6 is placed to cover the gate electrode 2, the gate line 3, the gate terminal 4 and the auxiliary capacitor electrode 5. Because the first conductive films 2a, 3a, 4a and 5a and the second conductive films 2b, 3b, 4b and 5b are placed below the gate insulating film 6, the gate insulating film 6 has two-level steps. Specifically, the height from the surface of the insulating substrate 1 to the surface of the gate insulating film 6 is different. The height is the highest in a back channel region (channel region) 11, which is described later. A semiconductor active film 7 is placed on the gate insulating film 6. The gate electrode 2 and the semiconductor active film 7 are placed opposite to each other with the gate insulating film 6 interposed therebetween. Specifically, the semiconductor active film 7 is placed above the thick film part and the thin film part of the gate electrode 2. Further, the semiconductor active film 7 is also placed immediately below a source electrode 9, a drain electrode 10, a source line 12 and a source terminal 13.

An ohmic contact film 8 is formed on the semiconductor active film 7. Impurity is implanted into the ohmic contact film 8 so as to have a lower resistance than the semiconductor active film 7. The ohmic contact film 8 is placed on the inside of the semiconductor active film 7. The ohmic contact film 8 is not placed at the center part above the gate electrode 2. Specifically, the ohmic contact film 8 is not placed above the second conductive film 2b. Note that a part of the ohmic contact film 8 is placed above the first conductive film 2a. Thus, the ohmic contact film 8 is placed on the part of the semiconductor active film 7 which corresponds to the thin film part on the outside of the thick film part. In other words, the ohmic contact film 8 is placed slightly outside the step portion of the semiconductor active film 7 that is formed because of the second conductive film 2b lying therebelow. The semiconductor active film 7 in the region where the ohmic contact film 8 is not formed is the back channel region 11.

Above the gate electrode 2, a part of the ohmic contact film 8 on the auxiliary capacitor electrode 5 side serves as a drain region, and a part of the ohmic contact film 8 on the opposite side from the auxiliary capacitor electrode 5 serves as a source region. The back channel region 11 is a region where a channel is formed when a gate voltage is applied to the gate electrode 2. Thus, when a gate voltage is applied to the gate electrode 2, a channel is formed near the interface with the gate insulating film 6 in the back channel region 11. Then, when a gate voltage is applied in the state where a given voltage is applied between the source region and the drain region, a drain current corresponding to the gate voltage flows between the source region and the drain region.

The source electrode 9, the drain electrode 10, the source line 12 and the source terminal 13 are placed on the ohmic contact film 8. An electrode film that forms the source electrode 9, the drain electrode 10, the source line 12 and the source terminal 13 is placed on the inside of the ohmic contact film 8. The inside as referred to herein includes the case where the ohmic contact film 8 and the electrode film substantially coincide when viewed from above. The source electrode 9 is placed on the source region. The source region and the source electrode 9 are directly in contact. Further, the source electrode 9 is formed integrally with the source line 12 and the source terminal 13. The source terminal 13 is formed at the end of the source line 12. The source terminal 13 is connected to the display signal driver 104 shown in FIG. 1, and a display signal (video signal) is input to the source terminal 13.

The drain electrode 10 is placed on the drain region. The drain region and the drain electrode 10 are directly in contact. The drain electrode 10 is formed to project from the part above the gate electrode 2 toward the auxiliary capacitor electrode 5. The TFT 108 is made up of the gate electrode 2, the gate insulating film 6, the semiconductor active film 7, the ohmic contact film 8, the source electrode 9, the drain electrode 10 and so on. The TFT 108 is an inversely staggered (bottom gate) TFT.

An interlayer insulating film 14 to serve as an insulating film is placed above the source electrode 9, the drain electrode 10, the source line 12 and the source terminal 13. The interlayer insulating film 14 is placed to cover the entire substrate. The interlayer insulating film 14 above the drain electrode 10 has a pixel-drain contact hole 15. The pixel-drain contact hole 15 is made to reach the drain electrode 10. Further, the gate insulating film 6 and the interlayer insulating film 14 above the gate terminal 4 have a gate terminal contact hole 16. The gate terminal contact hole 16 is made to reach the gate terminal 4. The gate terminal contact hole 16 is created wider than the second conductive film 4b. Further, the interlayer insulating film 14 above the source terminal 13 has a source terminal contact hole 17. The source terminal contact hole 17 is made to reach the source terminal 13.

A pixel electrode 19, a gate terminal pad 20, a source terminal pad 21 and a source line connection pad 22 are placed on the interlayer insulating film 14. The pixel electrode 19 is placed substantially all over the pixel 105. Further, the pixel electrode 19 is placed to overlap at least with the drain electrode 10 and the auxiliary capacitor electrode 5. The pixel electrode 19 and the auxiliary capacitor electrode 5 overlap with the gate insulating film 6 and the interlayer insulating film 14 interposed therebetween. The auxiliary capacitor 109 that holds a voltage applied to the pixel electrode 19 for a given length of time is thereby formed. A part of the pixel electrode 19 is buried in the pixel-drain contact hole 15. The pixel electrode 19 and the drain electrode 10 are thereby electrically connected through the pixel-drain contact hole 15.

As shown in FIG. 2, the gate terminal pad 20 has a rectangular shape that is slightly larger than the rectangular gate terminal contact hole 16, for example. The gate terminal contact hole 16 is formed on the inside of the gate terminal pad 20. The source terminal pad 21 and the source terminal contact hole 17 are formed in the same manner.

As shown in FIG. 3, the gate terminal pad 20 is placed on the gate terminal 4. A part of the gate terminal pad 20 is buried in the gate terminal contact hole 16. The gate terminal 4 and the gate terminal pad 20 are thereby electrically connected through the gate terminal contact hole 16. The source terminal pad 21 is placed on the source terminal 13. A part of the source terminal pad 21 is buried in the source terminal contact hole 17. The source terminal 13 and the source terminal pad 21 are thereby electrically connected through the source terminal contact hole 17.

As shown in FIG. 4, the source line 12 is split above the gate line 3. Specifically, the source line 12 and the ohmic contact film 8 are not placed above the second conductive film 3b. A source line split part 23 exists above the second conductive film 3b. A part of the source line 12 and the ohmic contact film 8 are placed above the first conductive film 3a. In other words, the source line 12 is split by the raised step portion formed by the presence of the second conductive film 3b. Further, the interlayer insulating film 14 on the split source line 12 has source line-source line contact holes 18. Thus, the source line split part 23 exists between the two source line-source line contact holes 18. The source line-source line contact hole 18 is made to reach the source line 12.

The source line connection pad 22 is placed on the source line 12 and the gate lines 3. Thus, the source line connection pad 22 is placed also in the source line split part 23. Specifically, the source line connection pad 22 is placed over the area from one source line-source line contact hole 18 to the other source line-source line contact hole 18. A part of the source line connection pad 22 is buried in the two source line-source line contact holes 18 between which the source line split part 23 exists. The split source lines 12 are thereby electrically connected through the source line-source line contact holes 18. The TFT substrate 100 has the above-described structure. The productivity and the performance are improved in such a structure.

A method of manufacturing the above-described TFT substrate 100 is described hereinafter with reference to FIGS. 5A to 6D. FIGS. 5A to 6D are sectional views showing the manufacturing method of the TFT substrate 100. FIGS. 5A to 5D correspond to FIG. 3, and FIGS. 6A to 6D correspond to FIG. 4.

First, the insulating substrate 1 having light transmitting properties such as a glass substrate or a quartz substrate is cleaned with pure water or hot sulfuric acid. Next, on the insulating substrate 1, a metal thin film composed of at least two layers is deposited as a first electrode film by sputtering or the like. In this example, the metal thin film composed of two layers including the first conductive films 2a, 3a, 4a and 5a and the second conductive films 2b, 3b, 4b and 5b is deposited. As the metal thin film, it is preferred to use Al, Mo, Cr with a low specific resistance or an alloy made mainly of those.

Then, the first photolithography process that coats photoresist, which is photosensitive resin, on the first electrode film by spin coating and then performs exposure and development of the coated resist is conducted. The photoresist is thereby patterned into a desired shape. After that, the first electrode film is etched by using the photoresist pattern as a mask and patterned into a desired shape. Specifically, the first conductive films 2a, 3a, 4a and 5a and the second conductive films 2b, 3b, 4b and 5b are etched and patterned. Further, the second conductive films 2b, 3b, 4b and 5b are formed on the inside of the first conductive films 2a, 3a, 4a and 5a. The gate electrode 2, the gate line 3, the gate terminal 4 and the auxiliary capacitor electrode 5 are thereby formed.

As a preferred example, an Al film to serve as the first conductive films 2a, 3a, 4a and 5a is deposited to a thickness of 100 nm by DC magnetron sputtering using known Ar gas. Further, a Mo film to serve as the second conductive films 2b, 3b, 4b and 5b is deposited to a thickness of 400 nm by DC magnetron sputtering using known Ar gas. Then, etching is performed by using known etchant containing phosphoric acid, nitric acid and acetic acid, and the laminated layer of the Al film and the Mo film is patterned.

Figure 6A:
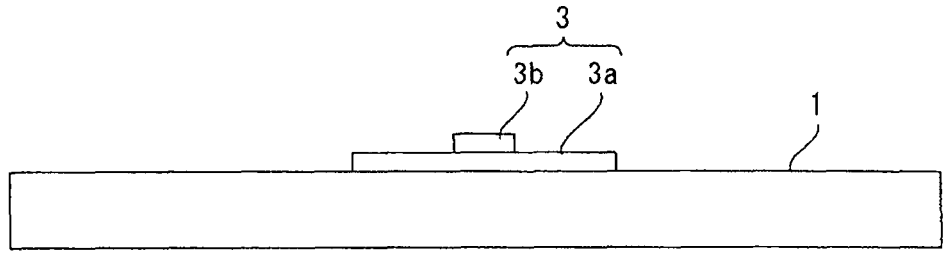
FIGS. 6A to 6D are sectional views showing a manufacturing method of the TFT substrate according to the exemplary embodiment.

In this example, etching is performed by using etchant with a composition ratio of 50 wt % of phosphoric acid, 10 wt % of nitric acid, 2.5 wt % of acetic acid and water and a liquid temperature of 40° C. In this case, an etching rate of the Mo film in the upper layer is generally higher than an etching rate of the Al film in the lower layer. Further, the etching of those films proceeds in an isotropic manner. Therefore, the side etching amount of the Mo film in the upper layer is larger than the side etching amount of the Al film in the lower layer. Accordingly, the sectional shape of the first electrode film is a raised shape in which the narrow Mo film is placed on top of the Al film. For example, as shown in FIG. 5A, the shape of the gate electrode 2 is a raised shape having the Al film serving as the first conductive film 2a and the Mo film serving as the second conductive film 2b with the pattern width Wb smaller than the pattern width Wa of the Al film. In this example, the raised shape in which Wa:Wb is about 4:1 is obtained. After that, the photoresist pattern is removed. In this step, the gate electrode 2, the gate line 3, the gate terminal 4 and the auxiliary capacitor electrode 5 are formed, so that the structure shown in FIGS. 5A and 6A is constructed.

Then, the gate insulating film 6, the semiconductor active film 7, the ohmic contact film 8 and a second electrode film are deposited in succession above the gate electrode 2, the gate line 3, the gate terminal 4 and the auxiliary capacitor electrode 5. After that, by the second photolithography process and etching, the second electrode film is patterned to thereby form the source electrode 9, the drain electrode 10, the source line 12 and the source terminal 13. Further, the semiconductor active film 7 and the ohmic contact film 8 are also patterned in this step, and the back channel region 11 of the TFT 108 is thereby formed. In this step, the structure shown in FIGS. 5B and 6B is constructed.

Figure 6B:
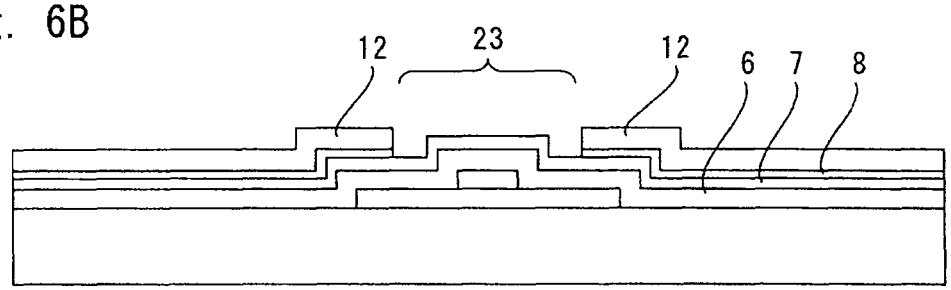

The manufacturing method shown in FIGS. 5B and 6B is described in detail with reference to FIGS. 7A to 7E and FIGS. 8A to 8D. Specifically, the step of forming the source electrode 9, the drain electrode 10, the source line 12, the source terminal 13 and the back channel region 11 is described in detail. FIGS. 7A to 7E are sectional views showing a detail of the manufacturing method shown in FIG. 5B. FIGS. 8A to 8D are sectional views showing a detail of the manufacturing method shown in FIG. 6B.

First, the gate insulating film 6, the semiconductor active film 7, the ohmic contact film 8 and the second electrode film 30 are deposited sequentially above the gate electrode 2, the gate line 3, the gate terminal 4 and the auxiliary capacitor electrode 5. Further, because the gate electrode 2, the gate line 3, the gate terminal 4 and the auxiliary capacitor electrode 5 have the raised shape as described earlier, a two-level raised shape is created on the surface of the film formed thereabove. Namely, the height from the surface of the insulating substrate 1 to the surface of the second electrode film 30 differs. Specifically, the part corresponding to the second conductive films 2b, 3b, 4b and 5b is the highest, the part corresponding to the first conductive films 2a, 3a, 4a and 5a on the outside of the second conductive films 2b, 3b, 4b and 5b is the second highest, and the part corresponding to the outside of the first conductive films 2a, 3a, 4a and 5a is the lowest. Thus, the second electrode film 30 has steps respectively above the peripheral part at both ends in the width direction of the first conductive films 2a, 3a, 4a and 5a and above the peripheral part at both ends in the width direction of the second conductive films 2b, 3b, 4b and 5b.

Figure 7D:
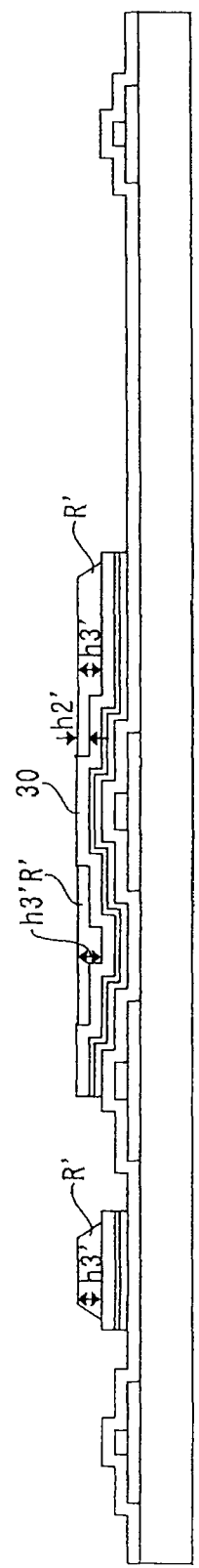
Figure 8A:
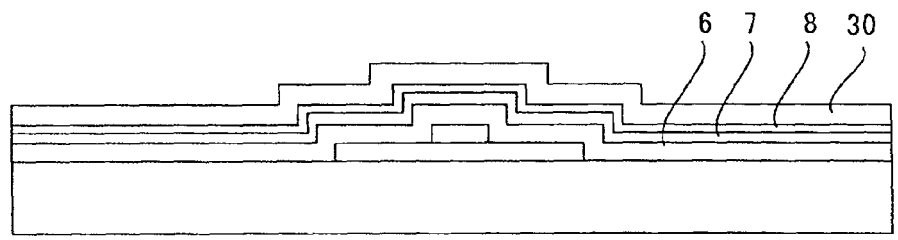
FIGS. 8A to 8D are sectional views showing a detail of the manufacturing method shown in FIG. 6B according to the exemplary embodiment.

As a preferred example, the gate insulating film 6, the semiconductor active film 7 and the ohmic contact film 8 are deposited in succession by using chemical vapor deposition (CVD). As the gate insulating film 6, a SiN film is used. The SiN film is deposited to a thickness of 400 nm. As the semiconductor active film 7, an intrinsic amorphous silicon (a-Si) film that does not contain impurity is used. The a-Si film is deposited to a thickness of 150 nm. As the ohmic contact film 8, a low resistance a-Si ($n^+$a-Si) film to which P (phosphorous) is added as impurity is used. The $n^+$a-Si film is deposited to a thickness of 50 nm. After that, the second electrode film 30 is deposited on the ohmic contact film 8 by DC magnetron sputtering using known Ar gas. A metal film may be used as the second electrode film 30. In this example, a Mo film is used as the second electrode film 30. The Mo film is deposited to a thickness of 200 nm. In this step, the structure shown in FIGS. 7A and 8A is constructed.

Then, by the second photolithography process, a photoresist pattern R is formed on the second electrode film 30. The surface of the photoresist pattern R is substantially even. Further, the second electrode film 30 has the two-level raised shape as described earlier. Therefore, the photoresist pattern R has three-level film thicknesses.

Specifically, the thickness of the photoresist pattern R is h1 above the second conductive films 2b, 3b, 4b and 5b, h2 above the first conductive films 2a, 3a, 4a and 5a on the outside of the second conductive films 2b, 3b, 4b and 5b, and h3 above the outside of the first conductive films 2a, 3a, 4a and 5a, where h1<h2<h3. Specifically, above the patterns of the gate electrode 2 and the gate line 3 in the gate/source lines intersection part, the thickness of the photoresist pattern R is h1, which is thinner than the thickness h2 or h3 of the other parts, due to the step of the second conductive films 2b and 3b. Therefore, the photoresist pattern R is the thinnest in the back channel region 11.

Figure 8B:
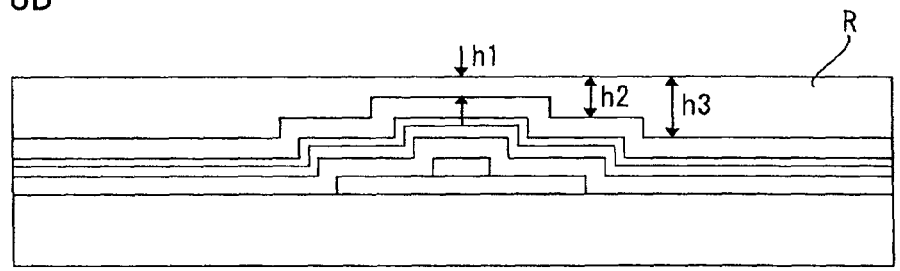

As a preferred example, positive photoresist of novolac resin is used as the photoresist pattern R. Then, the positive photoresist is deposited to a thickness of about 1.6 μm by a spin coater. After that, pre-bake is performed at 120° C. for about 90 seconds, and then exposure is performed by using the photomask pattern for forming the pattern of the source electrode 9, the drain electrode 10, the source line 12 and the source terminal 13. Note that halftone exposure is not performed in this step. The photomask pattern has two different levels of exposure intensity. Specifically, the photomask pattern has a region of 0% light exposure and a region of 100% light exposure, for example. After that, development is performed, thereby forming the photoresist pattern R on the second electrode film 30. Further, in this exemplary embodiment, the thickness h1 of the photoresist pattern R is about 1.1 μm, and the thickness h3 is about 1.6 μm. In this step, the structure shown in FIGS. 7B and 8B is constructed.

Then, the second electrode film 30 is etched by using the photoresist pattern R as a mask. After that, the semiconductor active film 7 and the ohmic contact film 8 are etched by using the photoresist pattern R and the second electrode film 30 as a mask. The second electrode film 30, the semiconductor active film 7 and the ohmic contact film 8 are thereby patterned into substantially the same shape as the planar shape of the photoresist pattern R. As a preferred example, the Mo film as the second electrode film 30 is etched by known wet etching. Then, the $n^+$a-Si film as the ohmic contact film 8 and the a-Si film as the semiconductor active film 7 are etched sequentially by dry etching using known gas containing fluorine such as $SF_6$. In this step, the structure shown in FIG. 7C is constructed.

Figure 8C:
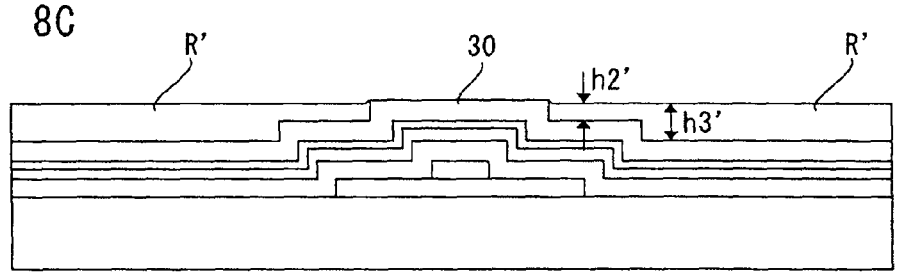

Then, the photoresist pattern R is thinned by resist ashing. The part of the photoresist pattern R with the thickness h1 is thereby removed. The second electrode film 30 above the second conductive films 2b, 3b, 4b and 5b is thereby exposed to the outside. On the other hand, the part of the photoresist pattern R with the thickness h2 and h3 is thinned and remains. The thickness h2 part of the photoresist pattern R thereby has a thickness of h2' (h2'<h2). Further, the thickness h3 part of the photoresist pattern R thereby has a thickness of h3' (h3'<h3). As a preferred example, the part of the photoresist pattern R with the thickness h1 is removed by resist ashing using known oxygen plasma. The photoresist pattern R' with the thickness h2' and the thickness h3' is thereby formed on the second electrode film 30. Because the resist removal progresses also in the plane direction during the thinning by resist ashing, the planar shape of the photoresist pattern R' after resist ashing is recessed to the inside (recessed by about 0.8 μm in this example) compared to the photoresist pattern R. In this step, the structure shown in FIGS. 7D and 8C is constructed.

Further, the exposed second electrode film 30 is etched away by using the photoresist pattern R' with the thickness h2' and h3' as a mask. In other words, the second electrode film 30 in the part where the photoresist pattern R is removed is etched away. Specifically, the part of the second electrode film 30 which corresponds to the thickness h1 part of the photoresist pattern R is etched away in FIGS. 7B and 8B. Thus, the second electrode film 30 is etched away above the second conductive films 2b, 3b, 4b and 5b. The ohmic contact film 8 is thereby exposed to the outside above the second conductive films 2b, 3b, 4b and 5b. After that, the exposed ohmic contact film 8 is etched away. The second electrode film 30 is patterned in this manner, thereby forming the source electrode 9, the source line 12, the source terminal 13 and the drain electrode 10. Further, in the back channel region 11 and the source line split part 23, the second electrode film 30 and the ohmic contact film 8 are removed and the semiconductor active film 7 is exposed to the outside. The planar shape of the source electrode 9, the source line 12, the source terminal 13, the drain electrode 10, and the ohmic contact film 8 placed therebelow is recessed to the inside compared to the pattern of the semiconductor active film 7 in the lower layer.

Figure 7E:
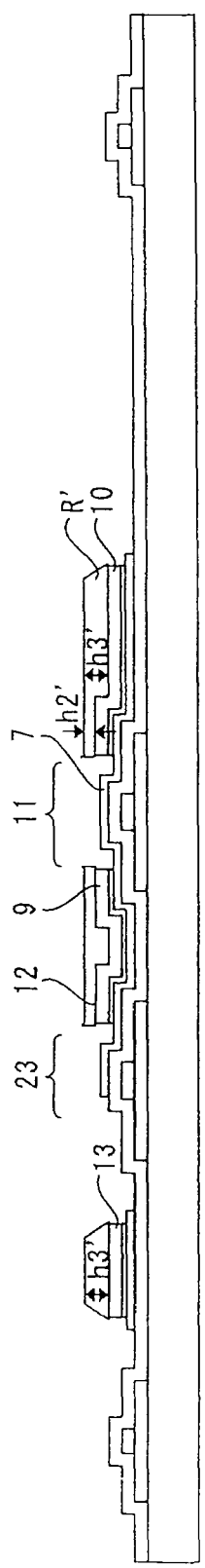
Figure 8D:
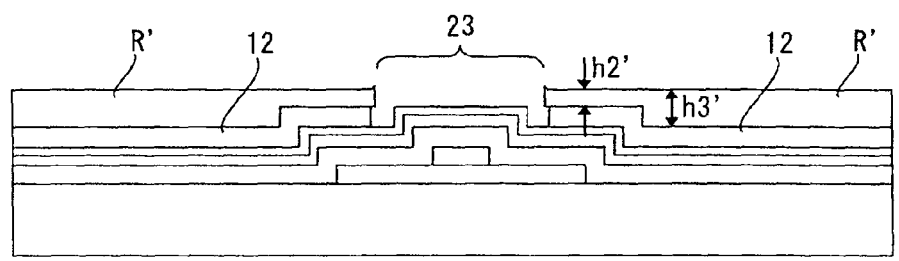

As a preferred example, the Mo film as the second electrode film 30 in the part where the photoresist pattern R is removed is etched away by known wet etching. Then, the $n^+$a-Si film as the ohmic contact film 8 is etched by dry etching using known gas containing fluorine. In this step, the structure shown in FIGS. 7E and 8D is constructed.

After that, the photoresist pattern R' is removed, so that the structure shown in FIGS. 5B and 6B is constructed. Then, the interlayer insulating film 14 is deposited to cover the source electrode 9, the source line 12, the source terminal 13, the drain electrode 10, and the back channel region 11. Then, the interlayer insulating film 14 and the gate insulating film 6 are patterned into a desired shape by the third photolithography process and etching, thereby removing the photoresist pattern. The pixel-drain contact hole 15, the gate terminal contact hole 16, the source terminal contact hole 17 and the source line-source line contact hole 18 are thereby created at the same time.

Specifically, the pixel-drain contact hole 15 is made by removing the interlayer insulating film 14 on the drain electrode 10. Thus, the drain electrode 10 is exposed to the outside at the pixel-drain contact hole 15. Further, the gate terminal contact hole 16 is made by removing the interlayer insulating film 14 and the gate insulating film 6 on the gate terminal 4. Thus, the gate terminal 4 is exposed to the outside at the gate terminal contact hole 16. Further, the source terminal contact hole 17 is made by removing the interlayer insulating film 14 on the source terminal 13. Thus, the source terminal 13 is exposed to the outside at the source terminal contact hole 17. Further, the source line-source line contact hole 18 is made by removing the interlayer insulating film 14 on the source line 12. Thus, the source line 12 is exposed to the outside at the source line-source line contact hole 18.

Figure 6C:
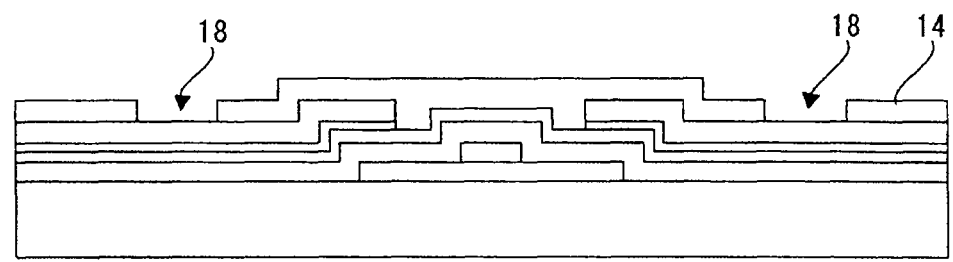

As a preferred example, a SiN film to serve as the interlayer insulating film 14 is deposited to a thickness of 300 nm by chemical vapor deposition (CVD). After that, by using the photoresist pattern as a mask, the pixel-drain contact hole 15, the gate terminal contact hole 16, the source terminal contact hole 17 and the source line-source line contact hole 18 are created simultaneously by dry etching using known fluorine gas such as $SF_6$. In this step, the structure shown in FIGS. 5C and 6C is constructed.

Then, a transparent conductive film to serve as the pixel electrode film is deposited on the interlayer insulating film 14. Then, the pixel electrode 19, the gate terminal pad 20, the source terminal pad 21 and the source line connection pad 22 are formed by the fourth photolithography process and etching. A part of the pixel electrode 19 is buried in the pixel-drain contact hole 15. The pixel electrode 19 and the drain electrode 10 are thereby electrically connected. A part of the gate terminal pad 20 is buried in the gate terminal contact hole 16. The gate terminal pad 20 and the gate terminal 4 are thereby electrically connected. A part of the source terminal pad 21 is buried in the source terminal contact hole 17. The source terminal pad 21 and the source terminal 13 are thereby electrically connected. A part of the source line connection pad 22 is buried in the source line-source line contact hole 18. The split source lines 12 are thereby electrically connected through the source line connection pad 22.

Figure 6D:
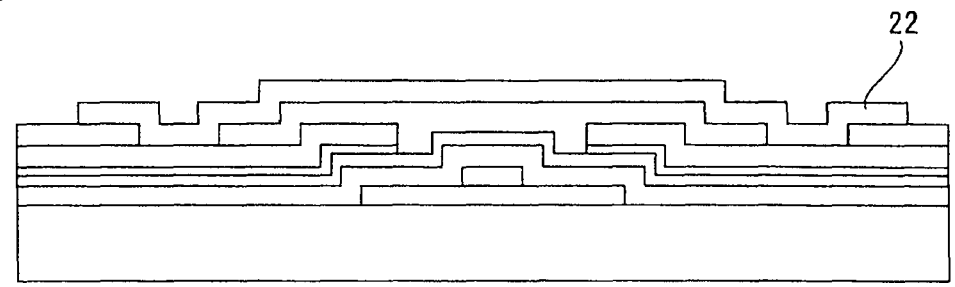

As a preferred example, an ITO film containing a mixture of indium oxide ($In_2O_3$) and tin oxide ($SnO_2$) is used as a known transparent conductive film. Then, the ITO film is deposited to a thickness of 100 nm by sputtering using known Ar gas. After that, the transparent conductive film is etched by using etchant containing known hydrochloric acid and nitric acid with use of the photoresist pattern as a mask. The pixel electrode 19, the gate terminal pad 20, the source terminal pad 21 and the source line connection pad 22 are thereby formed. In this step, the structure shown in FIGS. 5D and 6D is constructed, and the TFT substrate 100 is completed.

In this exemplary embodiment, the film thickness of the gate electrode 2 in the part corresponding to the back channel region 11 is large. Therefore, if photoresist is applied onto the second electrode film 30, the film thickness of the photoresist pattern R corresponding to the back channel region 11 is reduced. It is thus not necessary to perform halftone exposure, which has been hitherto performed when manufacturing the TFT substrate 100 by the four-time photolithography processes.

Because control of the halftone exposure is difficult, wide variation in channel length exists in the method used hitherto in which the width of the back channel region is determined depending on the state of halftone exposure. On the other hand, in the method according to the exemplarily embodiment, the width of the back channel region 11 is determined depending on the thickness of the gate electrode 2. Because the thickness of the gate electrode 2 is easily controllable, it is possible to reduce variations in channel length. It is thus possible to obtain the TFT substrate 100 with reduced variation in characteristics and improved performance. As described above, because the manufacturing process according to the exemplarily embodiment enables manufacturing of the TFT substrate 100 by the four-time photolithography processes without performing halftone exposure, the productivity and performance are improved.

Further, the raised step is formed in stripe in the gate electrode 2, and the stripe raised step extends in parallel with the channel width direction in the channel region of the TFT 108. Stated differently, because the step extends in a direction perpendicular to the channel length direction, the effective channel length of the TFT 108 is elongated, which enables reduction of an off-current.

The TFT 108 according to the exemplarily embodiment is a bottom gate TFT in which the back channel region 11 is formed by etching the ohmic contact film 8 having a low resistance. In this case, during etching of the ohmic contact film 8, there is a possibility that the component of the ohmic contact film 8 is re-deposited onto the side surface from the pattern end of the semiconductor active film 7 constituting the TFT 108. This raises an issue that the peripheral part of the TFT 108 forms a path of a leakage current between the source and drain electrodes. To avoid this, in the exemplarily embodiment, the planar patterns of the source electrode 9, the drain electrode 10, and the low-resistance ohmic contact film 8 placed in the lower layer of those electrodes are always recessed inside the pattern end of the semiconductor active film 7 in the lower layer. It is thereby possible to suppress the leakage current between the source and drain electrodes and reduce the off-current.

Further, the source line 12 is split in the step at the intersection between the gate line 3 and the source line 12. Then, the split source lines 12 are connected by using the source line connection pad 22, which is placed additionally. It is thereby possible to effectively prevent a break of the source line 12, which has been a troubling issue.

Therefore, in the TFT substrate 100 according to the exemplarily embodiment, variation in characteristics of the TFT 108 is small, and it is thus possible to suppress display unevenness and crosstalk. It is also possible to suppress line defect of display due to a break of the source lines 12. Accordingly, an active matrix liquid crystal display device using the TFT substrate 100 according to the exemplarily embodiment has high display quality. Further, the TFT substrate 100 can be manufactured with the four-time photolithography processes, thus enabling manufacturing with high production efficiency and low cost.

Note that, although the pattern size of the width Wa and the width Wb of the gate electrode 2 is Wa:Wb=about 4:1 as a preferred example in the exemplarily embodiment described above, it is not limited thereto. The pattern is preferably designed to at least satisfy Wa>3Wb. Further, although the etchant with a composition ratio of 50 wt % of phosphoric acid, 10 wt % of nitric acid, 2.5 wt % of acetic acid and water is used when etching the first conductive films 2a, 3a, 4a and 5a and the second conductive films 2b, 3b, 4b and 5b as a preferred example, it is also not limited thereto. The etchant preferably has a composition ratio of 40 to 80 wt % of phosphoric acid, 1 to 10 wt % of nitric acid, and 2 to 10 wt % of acetic acid, for example. Further, although the liquid temperature of the etchant is set to 40° C. as a preferred example, it is not limited thereto. A preferred liquid temperature range is 30° to 50° C., for example.

Furthermore, although the raised shape is formed by simultaneous etching of the Mo film in the upper layer (the second conductive films 2b, 3b, 4b and 5b) and the Al film in the lower layer (the first conductive films 2a, 3a, 4a and 5a) in the exemplarily embodiment described above, it is not limited thereto. The raised shape may be formed by selective etching of the Mo film in the upper layer and the Al film in the lower layer. For example, after only the Mo film in the upper layer is selectively etched by the first etching, the Mo film in the upper layer and the Al film in the lower layer are simultaneously etched by the second etching. Because the side etching of the Mo film in the upper layer progresses while etching away the Al film in the lower layer in the second etching, it is possible to form the raised shape without fail.

The first etching may be dry etching using known gas containing fluorine such as $SF_6$ or wet etching using etchant containing Ceric ammonium nitrate and perchloric acid. Further, the second etching may be wet etching using etchant containing phosphoric acid, nitric acid and acetic acid described above.

Further, although the thickness of the gate electrode 2 is varied by forming the gate electrode 2 having a two-layer lamination structure in the exemplarily embodiment described above, it is not limited thereto. The gate electrode 2 may have any structure as long as it has a thick film part in the area corresponding to the back channel region 11 and a thin film part which is thinner than the thick film part in the other area. For example, the gate electrode 2 may have a single-layer structure or a lamination structure of three or more layers. In this case also, it is possible to form the photoresist pattern R with a small film thickness in the area corresponding to the back channel region 11.

Furthermore, although an TIO film is used as the transparent conductive film in the exemplarily embodiment described above, it is not limited thereto, and an amorphous ITO film, an IZO film containing a mixture of indium oxide and zinc oxide, or an ITZO film containing a mixture of indium oxide, tin oxide and zinc oxide may be used. Because those transparent conductive films can be etched with oxalic acid etchant with weak acid, there is substantially no possibility of causing corrosion of the line and the electrode formed in the lower layer during etching, thereby improving the manufacturing yield of the TFT substrate 100.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A TFT substrate comprising:
    a gate electrode having a thick film part and a thin film part with a smaller film thickness than the thick film part;
    a semiconductor active film formed above the thick film part and the thin film part of the gate electrode;
    an ohmic contact film formed on an inside of the semiconductor active film and on the semiconductor active film corresponding to the thin film part on an outside of the thick film part; and
    an electrode film constituting a source electrode and a drain electrode, having a planar shape identical to or on an inside of the ohmic contact film, and formed on the ohmic contact film, wherein
    the semiconductor active film includes a step portion formed due to the shape of each of the thick film part and the thin film part, and
    the ohmic contact film is formed on the semiconductor active film that is not opposed to the step portion and the thick film part so that the semiconductor active film opposed to the thick film part and the step portion serve as a channel region.

2. The TFT substrate according to claim 1, wherein the gate electrode includes:
    a first conductive film; and
    a second conductive film having a smaller width than the first conductive film and formed on the first conductive film on an inside of the first conductive film.

3. The TFT substrate according to claim 1, further comprising:
    a gate line formed in the same layer as the gate electrode and having the thick film part and the thin film part;
    a source line made of the electrode film and being split above the thick film part of the gate line;
    an insulating film formed on the electrode film and having a pixel-drain contact hole above the drain electrode and source line-source line contact holes respectively above split portions of the source line;
    a pixel electrode electrically connected to the drain electrode through the pixel-drain contact hole; and
    a source line-source line connection pad formed in the same layer as the pixel electrode and electrically connecting the split portions of the source line through the source line-source line contact holes.

4. The TFT substrate according to claim 2, further comprising:
    a gate line formed in the same layer as the gate electrode and having the thick film part and the thin film part;
    a source line made of the electrode film and being split above the thick film part of the gate line;
    an insulating film formed on the electrode film and having a pixel-drain contact hole above the drain electrode and source line-source line contact holes respectively above split portions of the source line;
    a pixel electrode electrically connected to the drain electrode through the pixel-drain contact hole; and
    a source line-source line connection pad formed in the same layer as the pixel electrode and electrically connecting the split portions of the source line through the source line-source line contact holes.

5. A method of manufacturing a TFT substrate comprising steps of:
    forming a gate electrode having a thick film part and a thin film part with a smaller film thickness than the thick film part;
    depositing a semiconductor active film, an ohmic contact film and an electrode film sequentially above the gate electrode;
    applying photoresist on the electrode film;
    forming a photoresist pattern by exposing the photoresist with use of a photomask pattern with two different levels of exposure intensity;
    etching the semiconductor active film, the ohmic contact film and the electrode film with use of the photoresist pattern as a mask;
    thinning the photoresist pattern and removing the photoresist pattern above the thick film part; and
    forming a source electrode, a drain electrode and a channel region by etching the electrode film and the ohmic contact film with use of the thinned photoresist pattern as a mask, wherein
    the semiconductor active film includes a step portion formed due to the shape of each of the thick film part and the thin film part, and
    the ohmic contact film is formed on the semiconductor active film that is not opposed to the step portion and the thick film part so that the semiconductor active film opposed to the thick film part and the step portion serve as a channel region.

6. The method of manufacturing a TFT substrate according to claim 5, wherein the step of forming the gate electrode includes steps of:
    forming a first conductive film and a second conductive film sequentially; and
    patterning the first conductive film and the second conductive film so that a width of the second conductive film is smaller than a width of the first conductive film, and the second conductive film is placed on an inside of the first conductive film.

7. The method of manufacturing a TFT substrate according to claim 5, further comprising steps of:
    forming a gate line having the thick film part and the thin film part in the step of forming the gate electrode;
    forming a source line being split above the thick film part of the gate line in the step of forming the source electrode, the drain electrode and the channel region;
    depositing an insulating film to cover the source electrode, the source line, the drain electrode and the channel region after the step of forming the source electrode, the drain electrode and the channel region;
    making a pixel-drain contact hole in the insulating film above the drain electrode and source line-source line contact holes respectively above split portions of the source line;
    depositing a pixel electrode film on the insulating film having the pixel-drain contact hole and the source line-source line contact holes; and
    patterning the pixel electrode film and forming a pixel electrode electrically connected to the drain electrode through the pixel-drain contact hole and a source line-source line connection pad electrically connecting the split portions of the source line through the source line-source line contact holes.

8. The method of manufacturing a TFT substrate according to claim 6, further comprising steps of:
    forming a gate line having the thick film part and the thin film part in the step of forming the gate electrode;
    forming a source line being split above the thick film part of the gate line in the step of forming the source electrode, the drain electrode and the channel region;
    depositing an insulating film to cover the source electrode, the source line, the drain electrode and the channel region after the step of forming the source electrode, the drain electrode and the channel region;

making a pixel-drain contact hole in the insulating film above the drain electrode and source line-source line contact holes respectively above split portions of the source line;

depositing a pixel electrode film on the insulating film having the pixel-drain contact hole and the source line-source line contact holes; and patterning the pixel electrode film and forming a pixel electrode electrically connected to the drain electrode through the pixel-drain contact hole and a source line-source line connection pad electrically connecting the split portions of the source line through the source line-source line contact holes.

9. The TFT substrate according to claim 2, wherein the ohmic contact film is opposed to a portion of the first conductive film so as not to overlap a portion of the second conductive film.

10. The method of manufacturing a TFT substrate according to claim 6, wherein the ohmic contact film is opposed to a portion of the first conductive film so as not to overlap a portion of the second conductive film.

* * * * *